United States Patent
Gajapathy et al.

(10) Patent No.: US 11,545,209 B2
(45) Date of Patent: Jan. 3, 2023

(54) POWER SAVINGS MODE TOGGLING TO PREVENT BIAS TEMPERATURE INSTABILITY

(71) Applicant: Micron Technology, Inc., Boise, ID (US)

(72) Inventors: Parthasarathy Gajapathy, Mckinney, TX (US); Kallol Mazumder, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 54 days.

(21) Appl. No.: 17/333,203

(22) Filed: May 28, 2021

(65) Prior Publication Data
US 2022/0383930 A1    Dec. 1, 2022

(51) Int. Cl.
| G11C 11/4076 | (2006.01) |
| G06F 1/3234 | (2019.01) |
| G06F 1/3296 | (2019.01) |
| G11C 11/4093 | (2006.01) |

(52) U.S. Cl.
CPC ........ *G11C 11/4076* (2013.01); *G06F 1/3275* (2013.01); *G06F 1/3296* (2013.01); *G11C 11/4093* (2013.01)

(58) Field of Classification Search
CPC ............. G11C 11/4076; G11C 11/4093; G06F 1/3275; G06F 1/3296
USPC ...................................... 711/105; 365/189.02
See application file for complete search history.

(56) References Cited

U.S. PATENT DOCUMENTS

| 8,332,590 | B1* | 12/2012 | Rohana | G06F 12/0855 711/140 |
| 11,037,269 | B1* | 6/2021 | Schluessler | G06T 1/60 |
| 2007/0180156 | A1* | 8/2007 | Irish | G06F 12/1027 710/5 |
| 2007/0180157 | A1* | 8/2007 | Irish | G06F 12/0855 710/5 |
| 2007/0180158 | A1* | 8/2007 | Irish | G06F 12/1027 710/5 |
| 2007/0198756 | A1* | 8/2007 | Norgaard | G06F 1/14 710/39 |
| 2011/0225337 | A1* | 9/2011 | Byrne | G06F 13/4027 710/306 |
| 2014/0040587 | A1* | 2/2014 | Hasan | G06F 1/3275 711/E12.001 |
| 2014/0195790 | A1* | 7/2014 | Merten | G06F 9/3844 712/239 |
| 2014/0368505 | A1* | 12/2014 | Bavoil | G06T 15/005 345/426 |

(Continued)

FOREIGN PATENT DOCUMENTS

| DE | 112013003731 T5 * | 5/2015 | .......... G06F 9/3009 |
| WO | WO-2020013892 A1 * | 1/2020 | .......... G06F 1/3225 |

*Primary Examiner* — Michael T Tran
(74) *Attorney, Agent, or Firm* — Fletcher Yoder, P.C.

(57) ABSTRACT

Systems and methods for injecting a toggling signal in a command pipeline configured to receive a multiple command types for the memory device. Toggling circuitry is configured to inject the toggling signal into at least a portion of the command pipeline when the memory device is in a power saving mode and the command pipeline is clear of valid commands. The toggling is blocked from causing writes by disabling a data strobe when a command that is invalid in the power saving mode is asserted during the power saving mode.

23 Claims, 5 Drawing Sheets

(56) References Cited

U.S. PATENT DOCUMENTS

| | | | | |
|---|---|---|---|---|
| 2018/0061115 A1* | 3/2018 | Harris | ............... | H04N 13/279 |
| 2018/0129269 A1* | 5/2018 | Garg | ............... | G06F 9/4418 |
| 2018/0284871 A1* | 10/2018 | Surti | ............... | G06F 1/3243 |
| 2019/0165792 A1* | 5/2019 | Huh | ............... | H03L 7/0802 |
| 2021/0397372 A1* | 12/2021 | Sravan | ............... | G11C 16/0483 |

* cited by examiner

POWER SAVINGS MODE TOGGLING TO PREVENT BIAS TEMPERATURE INSTABILITY

BACKGROUND

Field of the Present Disclosure

Embodiments of the present disclosure relate generally to the field of semiconductor devices. More specifically, embodiments of the present disclosure relate to injecting toggling to mitigate degradation of memory devices.

Description of Related Art

Semiconductor devices (e.g., memory devices) may utilize a power saving mode to conserve power during non-active periods of the devices. While a memory device is in the power saving mode, there may be a limited number of valid commands available. When the memory device is in the power saving mode for a relatively long duration of time, the memory device may experience a long period of no valid commands being issued to the memory device. This may cause various parts (e.g., transistors in delay lines) of the memory device to degrade due to bias temperature instability (BTI) stress due to a lack of activity. Typically, to mitigate BTI stress, the inputs to a chip may be toggled to compensate for BTI stress using a BTI_toggle signal. However, the delay lines (and/or downstream devices) may be unable to be toggled in a similar manner due to the delay lines needing to remain free for receiving incoming valid commands while the memory device is in the power saving mode.

Embodiments of the present disclosure may be directed to address one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Memory devices encounter periods of inactivity during operation and may enter a power saving mode that has a reduced number of valid commands that may be received through delay lines of the memory device when compared to modes other than the power saving mode. The memory device may be in the power saving mode for a long duration of time without receiving any of these valid commands. This period of a lack of valid commands and resultant inactivity may cause components (e.g., transistors) in the delay lines to degrade due to bias temperature instability (BTI) stress. Typically, line toggling may be used to mitigate BTI (e.g., negative BTI (NBTI) or positive BTI (PBTI)) in transistors. However, the delay lines may not be toggled directly to compensate for BTI stress since the delay lines are to remain open to receive incoming valid commands. Embodiments disclosed herein provide systems and methods for compensation of BTI stress by injecting a forced toggle into a pipeline upstream of the delay lines to force the delay lines to toggle when no command is detected in the pipeline while enabling the pipeline to still receive incoming valid commands.

Figure 1:
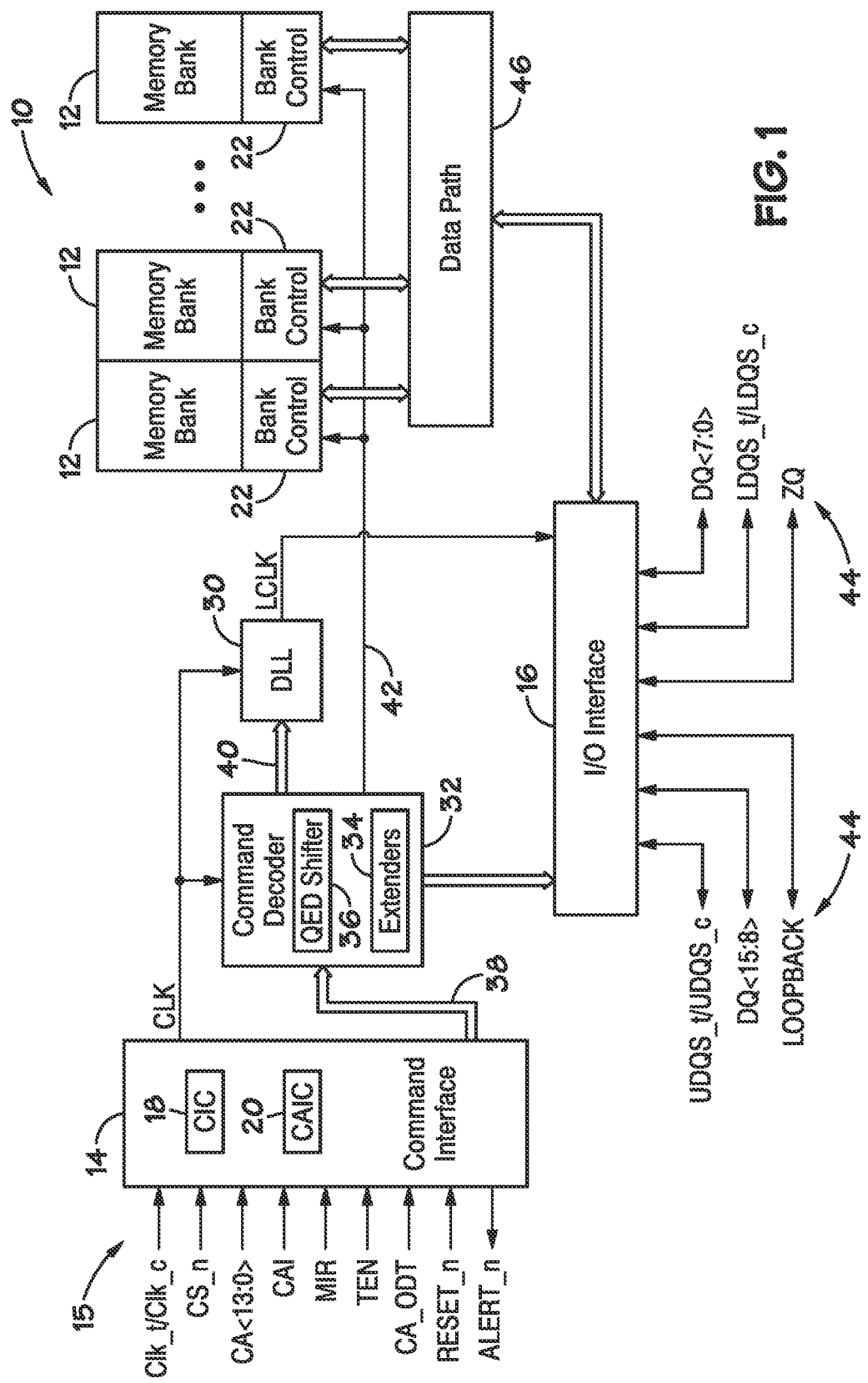
FIG. 1 is a simplified block diagram illustrating some features of a memory device, according to an embodiment of the disclosure.

FIG. 1 is a simplified block diagram illustrating some features of a memory device 10. In accordance with one embodiment, the memory device 10 may be a double data rate type five synchronous dynamic random access memory (DDR5 SDRAM) device. Various features of DDR5 SDRAM allow for reduced power consumption, increased bandwidth, and increased storage capacity compared to prior generations of DDR SDRAM. The memory device 10 represents a portion of a single memory chip (e.g., SDRAM chip) having a number of memory banks 12. The memory banks 12 may be, for example, DDR5 SDRAM memory banks. The memory banks 12 may be disposed on one or more chips (e.g., SDRAM chips) arranged on dual inline memory modules (DIMMS). Each DIMM may include a number of SDRAM memory chips (e.g., eight or sixteen memory chips). Each SDRAM memory chip may include one or more memory banks 12.

For DDR5, the memory banks 12 may be arranged to form bank groups. For example, the memory chip may include sixteen memory banks 12 for an eight gigabyte (8 Gb) DDR5 SDRAM. The memory banks 12 may be arranged into eight memory bank groups, each memory bank group including two memory banks. For a sixteen gigabyte (16 Gb) DDR5 SDRAM, the memory chip may include thirty-two memory banks 12, arranged into eight memory bank groups, each memory bank group including four memory banks 12, for instance.

Various other configurations, organizations, and sizes of the memory banks 12 on the memory device 10 may be utilized depending on the application and design of the overall system. In one embodiment, each memory bank 12 includes a bank control block 22, which controls execution of commands to and from the memory banks 12 for performing various functionality in the memory device 10, such as decoding, timing control, data control, and any combination thereof.

A command interface 14 of the memory device 10 is configured to receive and transmit a number of signals (e.g., signals 15). The signals 15 may be received from an external device (not shown), such as a processor or controller. The processor or controller may provide various signals 15 to the memory device 10 to facilitate transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the bar clock signal (Clk_c). A positive clock edge for DDR refers to the point where a rising true clock signal Clk_t crosses a falling bar clock signal Clk_c. A negative clock edge indicates a transition of a falling true clock signal Clk_t and a rising of the bar clock signal Clk_c. Commands (e.g., read command, write command, etc.) are typically entered on the positive edges of the clock signal. Data may be transmitted or received on both the positive and the negative clock edges.

The clock input circuit 18 receives the true clock signal (Clk_t) and the bar clock signal (Clk_c) and generates an internal clock signal, CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to an I/O interface 16, for instance, and is used as a timing signal for determining an output timing of read data. In some embodiments, as discussed below, the clock input circuit 18 may include circuitry that splits the clock signal into multiple (e.g., four) phases. The clock input circuit 18 may also include phase detection circuitry to detect which phase receives a first pulse when sets of pulses occur too frequently to enable the clock input circuit 18 to reset between pulses.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 38 and may decode the command signals to provide various internal commands. For instance, the command decoder 32 may provide command signals to the DLL circuit 30 over the bus 40 to coordinate generation of the phase controlled internal clock signal LCLK. The phase controlled internal clock signal LCLK may be used to clock data through the I/O interface 16, for instance.

Further, the command decoder 32 may decode incoming commands, such as read commands, write commands, mode-register set commands, activate commands, etc., and provide access to a particular memory bank 12 corresponding to the command via the bus path 42. As will be appreciated, the memory device 10 may include various other decoders, such as row decoders and column decoders, to facilitate access to the memory banks 12.

The command decoder 32 and/or any other portion of the memory device 10 may include command extenders 34. The command extenders 34 may extend the command signals for a duration of time required by certain operations of the memory device 10. That is, the command extenders 34 may be utilized for unique operations that use longer assertions of the command signals than possible without the command extenders 34. Additionally, the command decoder 32 may include a QED Shifter 36 for shifting the command signals to a selected Column Address Strobe Latency (CL) duration. The CL represents the number of clock cycles between the command signal being issued to the column decoder and when data is available from the memory bank 12 in response to the column decoder. In some embodiments, the command decoder 32 may be externally coupled to the QED Shifter 36 and the command extenders 34.

The memory device 10 executes operations, such as read commands and write commands, based on the command/address signals received from an external device, such as a processor. In one embodiment, the command/address bus 38 may be a 14-bit bus to accommodate the command/address signals (CA<13:0>). The command/address signals 15 are clocked to the command interface 14 using the clock signals (Clk_t and Clk_c). The command interface 14 may include a command address input circuit 20 which is configured to receive and transmit the commands to provide access to the memory banks 12 through the command decoder 32. In addition, the command interface 14 may receive a chip select signal (CS_n). The CS_n signal enables the memory device 10 to process commands on the incoming CA<13:0> bus. Access to specific memory banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus 38, for instance, depending on the command/address routing for the particular memory device 10. A mirror (MIR) signal may also be provided to facilitate a mirror function. The MIR signal may be used to multiplex signals so the signals can be swapped to enable certain routing of signals to the memory device 10, based on the configuration of multiple memory devices (such as memory device 10) in a particular application. Various signals to facilitate testing of the memory device 10, such as the test enable (TEN) signal, may be provided as well. For instance, the TEN signal may be used to place the memory device 10 into a test mode for connectivity testing.

The command interface 14 may also be used to provide an alert signal (ALERT_n) to the system processor or controller for errors that may be detected. For instance, the alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during some operations, such as the connectivity test mode executed using the TEN signal, as described above.

Data may be sent to and from the memory device 10, utilizing the command and clocking signals 15 discussed above, by transmitting and receiving data signals 44 through the I/O interface 16. More specifically, the data may be sent to or retrieved from the memory banks 12 over a datapath 46, which includes a plurality of bi-directional data buses.

Data I/O signals, generally referred to as DQ signals, are generally transmitted and received in one or more bi-directional data busses. For particular memory devices, such as a DDR5 SDRAM memory device, the I/O signals may be divided into upper and lower bytes. For instance, for a x16 memory device, the I/O signals may be divided into upper and lower I/O signals (e.g., DQ<15:8> and DQ<7:0>) corresponding to upper and lower bytes of the data signals, for instance.

To allow for higher data rates within the memory device 10, some memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals may be used as clock signals to capture the corresponding input data. As with the clock signals (Clk_t and Clk_c), the DQS signals may be provided as a differential pair of data strobe signals (DQS_t and DQS_c) to provide differential pair signaling during reads and writes. For some memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

An impedance (ZQ) calibration signal may also be provided to the memory device 10 through the I/O interface 16. The ZQ calibration signal may be provided to a reference pin and used to tune output drivers and ODT values by adjusting pull-up and pull-down resistors of the memory device 10 across changes in process, voltage, and temperature (PVT) values. Because PVT characteristics may affect the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the I/O pins.

In addition, a loopback signal (LOOPBACK) may be provided to the memory device 10 through the I/O interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the I/O interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is provided to highlight some functional features of the memory device 10 to aid in the subsequent detailed description.

As discussed above, the memory device 10 may remain idle during operation and may transition into a power saving mode (e.g., max power saving mode). While in the power saving mode, the memory device 10 may only receive a limited number of valid commands and or may expose the memory device 10 to BTI unless mitigated. These commands may be processed through a pipeline of the memory device 10.

Figure 2:
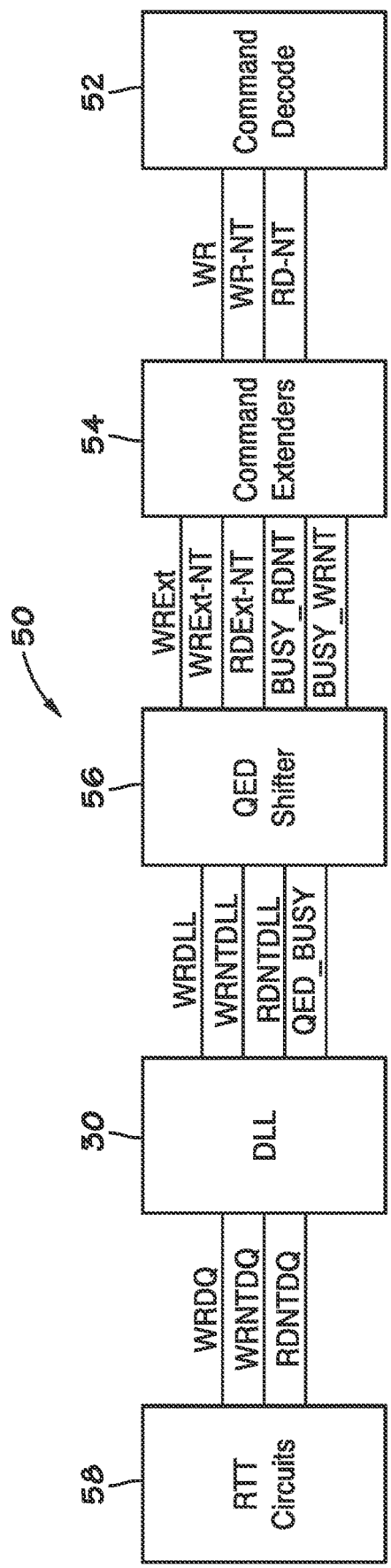
FIG. 2 is a simplified block diagram illustrating a pipeline for the memory device of the memory device of FIG. 1, according to an embodiment of the disclosure.

With the foregoing in mind, FIG. 2 is a simplified block diagram illustrating a pipeline 50 for the memory device 10 in the power saving mode. A command decoder 52 (e.g., the command decoder 32) may receive command signals from the command bus 38 and may decode the command signals to provide various internal commands. The command signals that the command decoder 52 may receive include Write commands (WR), Write Non-Target commands (WR-NT), and Read Non-Target commands (RD-NT) among other commands. During the power saving mode, only a subset of commands may be valid. For instance, in some embodiments, the only valid commands that the command decoder may receive and/or decode during the power saving mode include the Write Non-Target commands and the Read Non-Target Commands.

The command decoder 52 may be coupled to a command extender 54 (e.g., the command extenders 34). As previously noted, the command extenders 54 may extend the command signals to be asserted for a duration of time required by certain operations of the memory device 10. Valid outputs of the command extender 54 may be extended versions of incoming commands, such as a WRExt signal, a WRExt-NT signal, and/or a RDExt-NT signal in response to receiving the respective WR, WR-NT, and/or the RD-NT signals. Furthermore, when the command extender 54 receives a Write Non-Target or a Read Non-Target command, it may output a respective busy signal, e.g., BUSY-WRNT or a BUSY-RDNT, to indicate that a Non-Target command is incoming/being processed within the command extender 54.

The command extender 54 may be coupled to a QED shifter 56. The QED shifter 56 may include multiple flip-flops that may shift the command signals from the command extender 54. In some embodiments, the QED shifter 56 may have multiple outputs from which a selected signal is selected according to a selection of the length of the Column Address Strobe Latency (CL). As previously noted, the CL represents the number of clock cycles between the command signal being issued to the command decoder 52 and when data utilized for the commands decoded by the command decoder 52 is available from the memory bank 12. In response to receiving the WRExt signal, the WRExt-NT signal, or the RDExt-NT signal, the QED shifter 56 may output respective DLL signals, such as respective WRDLL, WRNTDLL, or RDNTDLL signals. While any of the listed commands are being shifted by the QED shifter 56, the QED shifter 56 may output a QED_BUSY signal to indicate that the command has not yet left the QED shifter 56. In some embodiments, the QED shifter 56 may output one or more of the signals (WRDLL, WRNTDLL, and RDNTDLL) simultaneously. In certain embodiments, the QED shifter 56 may assert one or more of the signals (WRDLL, WRNTDLL, and RDNTDLL) due to BTI toggling without receiving the respective signals from the command extender 54.

The QED shifter 56 may be coupled to the DLL circuit 30. The DLL circuit 30 utilizes delay lines as inputs/outputs. As discussed above, the DLL circuit 30 generates the phase controlled internal clock signal LCLK based on the received internal clock signal CLK and transmits the LCLK to RTT circuitry 58 to be used to apply on-die termination (RTT) to carry out the execution of commands in the memory device 10. That is, the DLL circuit 30 may be the interface between the other parts of the pipeline 50 and the memory device 10. The DLL circuit 30 may output a WRDQ signal, a WRNTDQ signal, and/or a RDNTDQ signal to the RTT circuitry 58 through the I/O interface 16, where the I/O interface 16 receives the DQ signals.

As discussed above, the memory device 10 may enter a power saving mode, which conserves power while allowing for a reduced number of valid commands to move through the pipeline 50. The memory device 10 may be in a power saving mode for a long duration of time and no valid commands are issued to the memory device 10. This may cause transistors on the delay lines of the DLL circuit 30 to degrade due to bias temperature instability (BTI) stress. BTI stress affects transistors of the memory device 10 since the transistors are implemented using semiconductors. (e.g., MOSFETs).

BTI stress may occur when the transistors of the memory device 10 accumulate positive (in the case of a pMOS or negative (for nMOS) charges. The charges are trapped at the oxide-semiconductor boundary underneath the gate of a MOSFET. These trapped charges partially cancel the gate voltage without contributing to conduction through the channel. When the gate voltage is removed, the trapped charges may dissipate across an area of the gate. As such, the size of the gate area may be used to mitigate the effects of BTI stress. However, as transistors continue to shrink with the size of electronic devices, mitigating BTI stress by altering the physical aspects of the MOSFET is not always feasible. BTI stress is reflected as a change in threshold voltage, drain current, and/or transconductance of the MOSFET. BTI stress in the memory device 10 may be at least partially attributed to a lack of usage of transistors within the memory device 10 during power saving modes. The degree of negative effects caused from BTI stress may vary from device to device.

To mitigate BTI stress arising from inactivity during power saving modes, the memory device 10 may force toggling through the delay lines of the DLL circuit 30 within the memory device 10 without interrupting any commands in the pipeline 50 while the memory device 10 is in power saving mode. The delay lines of the DLL circuit 30 may be difficult to toggle since the delay lines of the DLL circuit 30 may be utilized for incoming commands at any time. Thus, forcing a toggle through the delay lines of the DLL circuit 30 by injecting a BTI toggling signal into the pipeline 50 at the QED shifters 56 may cause toggling on at least a subset of its available outputs (WRDLL, WRNTDLL, and RDNTDLL). In some embodiments, the forced toggle may be injected at any location in the pipeline 50. For instance, toggling may be injected at any location (e.g., the command decoder 52, the command extenders 54, or the QED shifters 56) of the pipeline 50. By forcing the toggling of the delay lines of the DLL circuit 30 while the memory device 10 is in a power saving mode, the buildup of charges at the gate of the MOSFET may be mitigated and may slow/stop the degradation of the delay lines of the DLL circuit 30 of the memory device 10. It should be noted that the toggling of the delay lines of the DLL circuit 30 may be at a slower frequency than the external clock. For instance, the BTI toggling signal may cycle at a first rate (e.g., every 500 nanoseconds) while the external clock may toggle at a second rate (e.g., every 384 picoseconds or faster). The lower frequency of the BTI toggling signal may be used to reduce power consumption used in the BTI toggling relative to switching using the external clock.

Returning to FIG. 2, in some embodiments, the memory device 10 may only force the toggle through to the delay lines of the DLL circuit 30 when BUSY_RDNT, BUSY_WRNT, and QED_BUSY are all low. When these conditions are met, the memory device 10 may interpret that there is no incoming command in the pipeline 50 and the command has already exited the QED shifter 56. Both BUSY_WRNT and BUSY_RDNT may represent busy signals whenever the command extenders 54 is in operation for the respective WR_NT and RD_NT commands. As soon as either BUSY_WRNT or BUSY_RDNT is asserted, the toggling is stopped, and the QED shifter 56 is set in the correct state for the incoming command.

Figure 3:
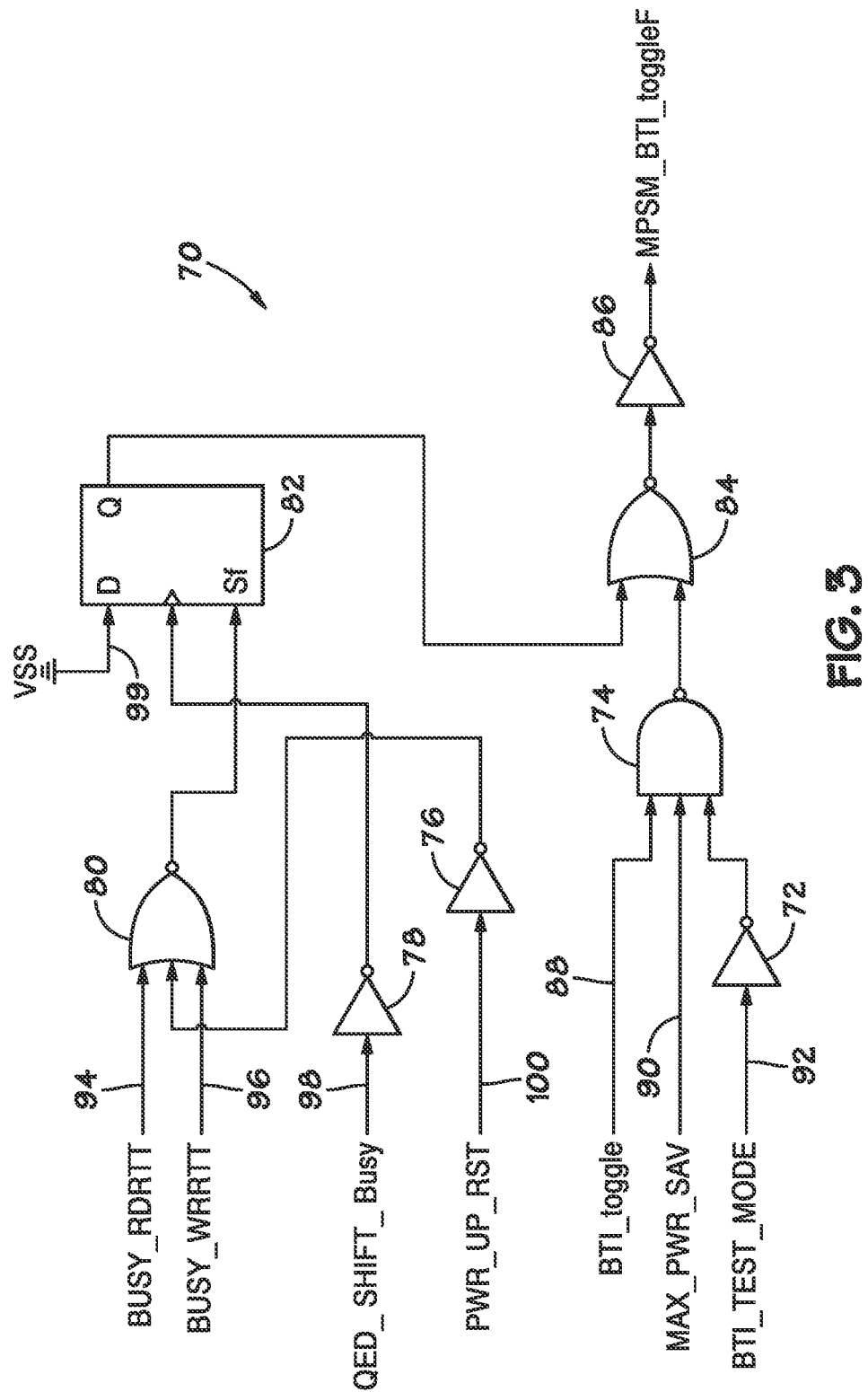
FIG. 3 is a schematic diagram of an implementation of BTI toggling circuitry used to inject BTI toggling into the pipeline of FIG. 2, according to an embodiment of the disclosure.

With the foregoing in mind, FIG. 3 is a diagram of toggling circuitry 70 as an implementation used to perform BTI toggling by selective toggling through the delay lines of the DLL circuit 30. The toggling circuitry 70 may be implemented in the QED shifter 56 and/or outside of the QED shifter 56 in another portion of the memory device 10. As previously discussed, although the foregoing discussion will focus on injecting the toggle signal into the pipeline 50 via the QED shifter 56, the toggling may be injected at any point along the pipeline 50. As illustrated, the toggling circuitry 70 may include an inverter 72, a NAND gate 74, an inverter 76, an inverter 78, a NOR gate 80, a flip-flop 82, a NOR gate 84, and an inverter 86.

A signal BTI_toggle is supplied along a line 88 into the NAND gate 74. The BTI_toggle signal is the toggling signal utilized to inject toggling through the DLL circuit 30. In some embodiments, the BTI_toggle signal may be slower than the external clock to minimize power consumption. Another signal MAX_PWR_SAV is supplied along a line 90 into the NAND gate 74. The MAX_PWR_SAV signal indicates that the memory device 10 is in or is to enter a power saving mode. When the MAX_PWR_SAV signal is asserted, the memory device 10 is currently in a maximum power saving mode (or any other power save modes with reduced command sets). Also, when the MAX_PWR_SAV signal is asserted, the NAND gate 74 allows the BTI_toggle signal to flow through unless prohibited by a test mode. A third signal, BTI_TEST_MODE, may be supplied along a line 92 into the inverter 72, which inverts and supplies the BTI_TEST_MODE signal to the NAND gate 74. The BTI_TEST_MODE signal is representative of a test mode signal that may be used to disable the BTI toggling for various test modes. The BTI_TEST_MODE signal may default high unless the memory device 10 is undergoing testing, in which case BTI_TEST_MODE signal may be not asserted. In some embodiments, the three signals, the BTI_toggle signal, the MAX_POWER_SAV signal, and the BTI_TEST_MODE may be received via one or more respective mode registers from a host device. Thus, the BTI_TEST_MODE and the MAX_POWER_SAV, may be used to gate toggling of the BTI_toggle signal from reaching the NOR gate 84 when the memory device 10 is in a test mode and/or when a power saving mode is not active.

The signal BUSY_RDRTT is supplied along a line 94, and a signal BUSY_WRRTT is supplied along a line 96 into the NOR gate 80. The BUSY_RDRTT and the BUSY_WRRTT may indicate whether ODT termination has been asserted. For instance, the BUSY_RDRTT may be based on the BUSY_RDNT and/or the same as BUSY_RDNT, and the BUSY_WRRTT may be based on the BUSY_WRNT and/or the same as the BUSY_WRNT. Both BUSY_RDRTT and BUSY_WRRTT may indicate that a Read or Write Non-Target Command (RTT) is in the pipeline 50. Additionally, a signal PWR_UP_RST may be supplied along a line 100 into the inverter 78, where the signal is inverted and supplied to NOR gate 80. The PWR_UP_RST signal indicates that the memory device 10 has been powered up and/or reset to a restart state. The PWR_UP_RST signal may be utilized to ensure that the flip-flop 82 is set to a correct default state (e.g., outputting a 0) during startup of the memory device 10. That is, the PWR_UP_RST signal resets the flip-flop 82 to be asserted only if both BUSY_RDNT and BUSY_WRNT are not asserted. If any of BUSY_RDRTT, BUSY_WRRTT, and PWR_UP are asserted, then the NOR gate 80 output is not asserted. The NOR gate 80 supplies a reset input to the flip-flop 82. In other words, if a command is in the pipeline 50 or has been restarted, the flip-flop 82 is reset to the default state.

A signal QED_SHIFT_BUSY (e.g., the QED_BUSY signal of FIG. 2) is supplied along a line 98 into the inverter 78 where the signal is inverted and supplied to the flip-flop 82 as a clock for the flip-flop 82. As previously noted, the QED_SHIFT_BUSY signal may indicate that the QED shifter 56 is busy, and the delay lines of the DLL circuit 30 cannot be toggled. The flip-flop 82 may latch in a VSS voltage (e.g., 1) using a data input that is supplied along a line 99 into the flip-flop 82 when the QED_SHIFT_BUSY signal is low. That is, the flip-flop 82 output is a logic high if the NOR gate 80 output is a logic high, causing the flip-flop 82 to clock in the voltage via the line 99. That is, the NOR gate 80 output will be a logic high until either BUSY_RDRTT or BUSY_WRRTT transition high or until the PWR_UP_RST signal transitions. Once the NOR gate 80 supplies a low output to the flip-flop 82, the flip-flop 82 output is set to the default value (e.g., 0).

The output of the flip-flop 82 is transmitted to the NOR gate 84. The output of the flip-flop 82 may serve as to gate the injection of the forced toggle from the NAND gate 74 in the event that a command signal for the Read or Write Non-Target commands is detected within the pipeline 50 since a high output from the flip-flop 82 will force an output of the NOR gate 84 low. When the flip-flop 82 is held low, the NOR gate 84 tracks the output of the NAND gate 74. The flow through of the BTI_toggle signal through the NAND gate 74 and/or the NOR gate 84 may cause inversion of the BTI_toggle signal or may cause the BTI_toggle signal to flow through non-inverted depending on the particular implementation. The NOR gate 84 supplies its output to the inverter 86 to correct logic polarity and/or to amplify an output signal MPSM_BTI_toggleF along output line 102. The MPSM_BTI_toggleF signal is a toggling signal that is driven by the BTI_toggle signal when toggling is enabled for power saving modes through the toggling circuitry 70. When the various signals cause the BTI_toggle signal to flow through the NAND gate 74 and the NOR gate 84 as the MPSM_BTI_toggleF, the memory device 10 may force the toggling of the delay lines of the DLL circuit 30 by forcing the BTI_toggle signal through the QED shifter 56 outputs (WRDLL, WRNTDLL, and RDNTDLL).

Figure 4:
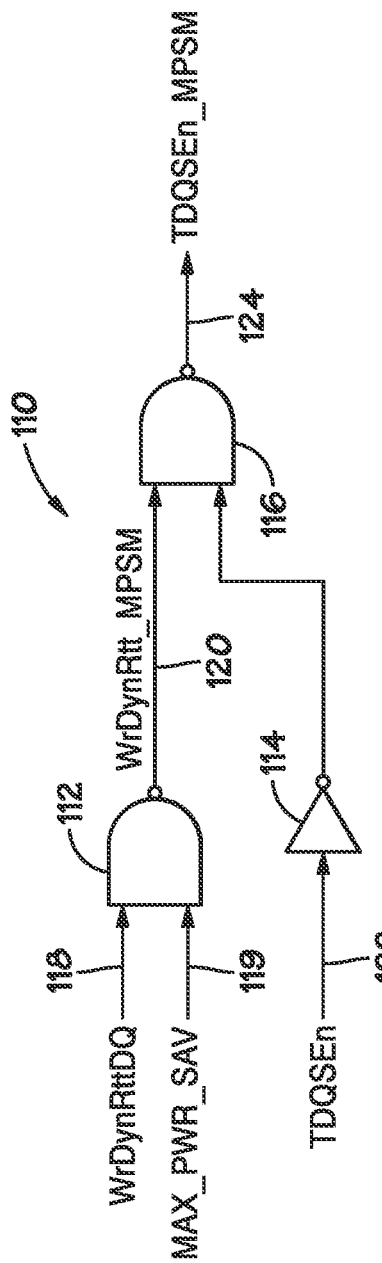
FIG. 4 is a schematic diagram of logic circuitry used to mitigate contention of incoming signals during BTI toggling using the BTI toggling circuitry of FIG. 3, according to an embodiment of the disclosure.

FIG. 4 is schematic diagram of resolution circuitry 110 used to address contention of toggled signals toggled using the BTI_toggle signal. When multiple (e.g., 3) outputs of the QED shifter 56 are actively toggled with the BTI_toggle signal, the toggling of the delay lines of the DLL circuit 30 may cause contention in the RTT state between DQ signals. Thus, any enable signal in the DQ signals may be gated to prevent writing/reading during power saving mode while the delay lines of the DLL circuit 30 are being forcibly toggled.

The resolution circuitry 110 may include a NAND gate 112, an inverter 114, and a NAND gate 116. A signal WrDynRttDQ is supplied on a line 118 to the NAND gate 112. The WrDynRttDQ signal may represent an RTT assertion for the write command from the DLL circuit 30. In other words, the WrDynRttDQ signal may be toggled during the BTI toggling process using the MPSM_BTI_TOGGLE signal from FIG. 3. In some embodiments, other signals in the pipeline 50 may serve as the signal supplied on the line 118. For instance, in some embodiments, this input may be limited to a command type that is not permitted in the power saving mode. The MAX_PWR_SAV signal is also supplied to the resolution circuitry 110 along a line 119 to the NAND gate 112. As previously noted, the MAX_PWR_SAV signal indicates when the memory device 10 is in a power saving mode. The NAND gate 112 supplies a WrDynRtt_MPSM signal to an output line 120, which supplies one of the NAND gate 116 inputs. The WrDynRtt_MPSM signal is asserted unless the WrDynRtt_MPSM signal and the MAX_PWR_SAV signal are both asserted. In other words, the NAND gate 112 stops propagation of a write command outside of the specification for the power saving mode when asserted while the power saving mode is asserted. The NAND gate 112 outputs a logical low when both the MAX_PWR_SAV signal and the WrDynRttDQ signal are logically high. This ensures that whenever the write command is coming through the pipeline 50 while the memory device 10 is in power saving mode, the NAND gate 112 prevents the pulses from the BTI_toggle signal from propagating data to the DQ lines to be captured in memory cells using DQS signals. That is, the NAND gate 112 traps toggling of the WrDynRttDQ signals that coincide with assertions of the MAX_PWR_SAV mode and keeps toggles from the WrDynRttDQ signals from propagating by cutting off the toggling from DQS lines while the MAX_PWR_SAV mode is active.

A signal TDQSEn may also be supplied on a line 122 to the inverter 114. The TDQSEn signal may be used to enable DQS toggling used to capture data on the DQ lines for writes when they are not trapped using the NAND gate 112. The inverter 114 inverts and supplies the inverted TDQSEn signal to the NAND gate 116. As such, the NAND gate 116 is used to gate DQS signaling using the TDQSEn signal when DQS is not to be enabled. When the TDQSEn signal is enabled, the NAND gate 112 transmits an output that tracks the WrDynRtt_MPSM signal on the TDQSEn_MPSM signal on line 124. The TDQSEn_MPSM signal is used to drive the DQS that enables data to be captured on the DQ lines. Otherwise, the NAND gate 116 blocks transmission of the WrDynRtt_MPSM signal as the TDQSEn_MPSM signal. Thus, the resolution circuitry 110 suppresses assertion of DQS when the paths corresponding to the write command (or another invalid command during the power saving mode) are asserted/toggling during the power saving mode.

Figure 5:
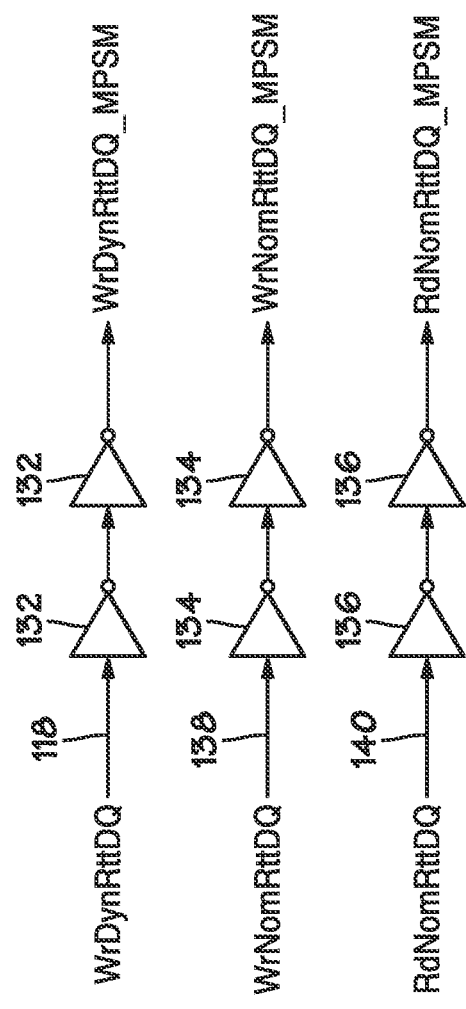
FIG. 5 is a schematic diagram of logic circuitry used to synchronize signals in the pipeline and to compensate for delays due to the logic circuitry of FIG. 4, according to an embodiment of the disclosure.

When toggling is not occurring, the timings of the RTT states still may need to be synchronized with the exterior clock. That is, the resolution circuitry 110 may add timing delays into the pipeline 50 due to the delays introduced by the NAND gate 112, inverter 114, and/or the NAND gate 116. With the foregoing in mind, FIG. 5 is a diagram of delay circuitry 130 that is used to synchronize the RTT commands from the pipeline 50 with the exterior clock. The delay circuitry 130 may include a pair of inverters 132, a pair of inverters 134, and a pair of inverters 136.

The signal WrDynRttDQ is supplied along the line 118 into the pair of inverters 132. A signal WrNomRttDQ corresponding to non-targeted read commands is supplied along a line 138 into the pair of inverters 134. A signal RdNomRttDQ corresponding to non-targeted write commands is supplied along a line 140 into the pair of inverters 136. Both the WrNomRttDQ signal and the RdNomRttDQ signal represent the write and read non-target commands valid for the memory device 10, respectively. The pairs of inverters 132, 134, and 136 may output WrDynRttDQ_MPSM, WrNomRttDQ_MPSM, and RdNomRttDQ_MPSM signals, respectively. The two inverters per pair of inverters may cause the same logical value to be output with a delay to match delays in the circuitry of FIG. 4.

Figure 6:
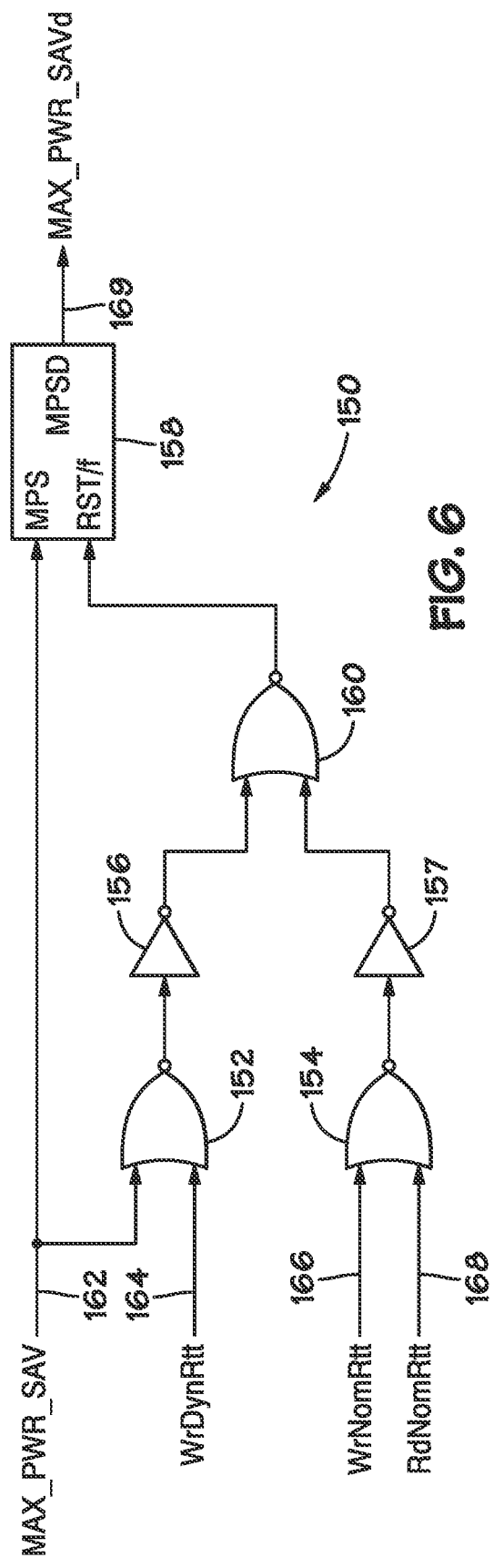
FIG. 6 is a schematic diagram of logic circuitry for transitioning from a power saving mode and normal operation, according to an embodiment of the disclosure.

In certain embodiments, the command for the memory device 10 to exit power saving mode may be sent during BTI toggling. However, if the MAX_PWR_SAV signal is turned off while the RTT signals that are output from the DLL circuit 30 during BTI toggling are still high, the wrong RTT state may be applied. To ensure that the power saving mode is not turned off before BTI toggling has propagated through a portion (e.g., DLL circuit 30) of the pipeline 50, the memory device 10 may use 1) a latch to hold the MAX_PWR_SAV signal deassertion until after the propagation has completed, 2) inserting a delay for MAX_PWR_SAV signal deassertions by a maximum propagation time through which a command travels through the portion or complete pipeline 50, and 3) counting a number of BTI toggles entering the portion/pipeline 50 and exiting the portion/pipeline 50 to determine whether all toggling pulses have cleared the portion/pipeline 50. With the foregoing in mind, FIG. 6 is a diagram of logic circuitry 150 used to implement a successful transition between the power saving mode and normal operation by ensuring, using a latch, that all the delay lines of the DLL circuit 30 have cleared before transitioning to the power saving mode.

The logic circuitry 150 may delay the transition between power saving mode to another mode (e.g., normal operation) of the memory device 10 to ensure that the BTI toggling has cleared out from the delay lines of the DLL circuit 30. The logic circuitry 150 may include a NOR gate 152, a NOR gate 154, an inverter 156, an inverter 157, a latch 158, and a NOR gate 160. The MAX_PWR_SAV signal is supplied along a line 162 as inputs to the NOR gate 152 and the latch 158. As previously noted, the MAX_PWR_SAV signal may indicate that the memory device 10 has already entered or is to enter power saving mode. Thus, when the MAX_PWR_SAV signal transitions low, the memory device 10 is to exit the power saving mode. However, the logic circuitry 150 may delay this exit until BTI toggling has propagated through and exited the pipeline 50. In addition to or alternative to the latch 158, the logic circuitry 150 may include a delay tuned to a duration to propagate the BTI toggling through the portion/pipeline 50. Additionally or alternatively, the logic circuitry 150 may include a first counter counting BTI pulses entering the portion/pipeline 50 and a second counter counting BTI pulses exiting the portion/pipeline 50 to delay deassertion of the MAX_PWR_SAV until the portion/pipeline 50 has been cleared of BTI toggles.

The WrDynRTT signal is supplied along a line 164 as another input into the NOR gate 152. The NOR gate 152 may be used to gate the MAX_PWR_SAV signal when switching out of the power saving mode unless the pipeline 50 is clear of an toggling/assertions of the WrDynRTT for write commands in the delay lines of the DLL circuit 30. When the MAX_PWR_SAV signal transitions low, the output of the NOR gate 152 is transitions high if the WrDynRTT is not high. The NOR gate 152 may supply an output to the inverter 156, where the inverter 156 inverts the output from the NOR gate 152 and supplies an input to the NOR gate 160.

The WrNomRTT and RdNomRTT signals may be supplied along respective lines 166 and 168, each serving as an input to the NOR gate 154. In a manner similar to that used by the NOR gate 152, the NOR gate 154 will output a logical low unless the pipeline 50 is clear of non-targeted read and write commands (e.g., the WrNomRTT and RdNomRTT signals are low). The NOR gate 154 may supply its output to the inverter 157. The inverter 157 inverts the signal from the NOR gate 154 and supplies the signal to the NOR gate 160. The output of the NOR gate 160 may be a logical high unless each of the outputs from the NOR gate 152 and the NOR gate 154 are both low, which may only occur when the pipeline 50 and the delay lines of the DLL circuit 30 are clear and the memory device 10 is exiting the power saving mode.

The NOR gate 160 may supply its output at a reset pin of the latch 158. The reset pin (e.g., RST or RSTf) may be used to reset the latch 158 to output a deassertion of the MAX_PWR_SAV signal. As such, the output of the latch 158 is a delayed transition of the MAX_PWR_SAV signal (i.e., a MAX_PWR_SAVD signal) at an output line 169 when the pipeline 50 is clear. In other words, the MAX_PWR_SAVD signal indicates that the delay lines of the DLL circuit 30 are clear and that exiting the power saving mode may be completed. In some embodiments, the signals on the lines 164, 166, and 168 may be sampled from multiple locations in the pipeline 50. These signals may be combined (e.g., using an OR gate) such that any assertion/toggle that is sampled at any location in the pipeline 50 will block the reset of the latch 158.

Figure 7:
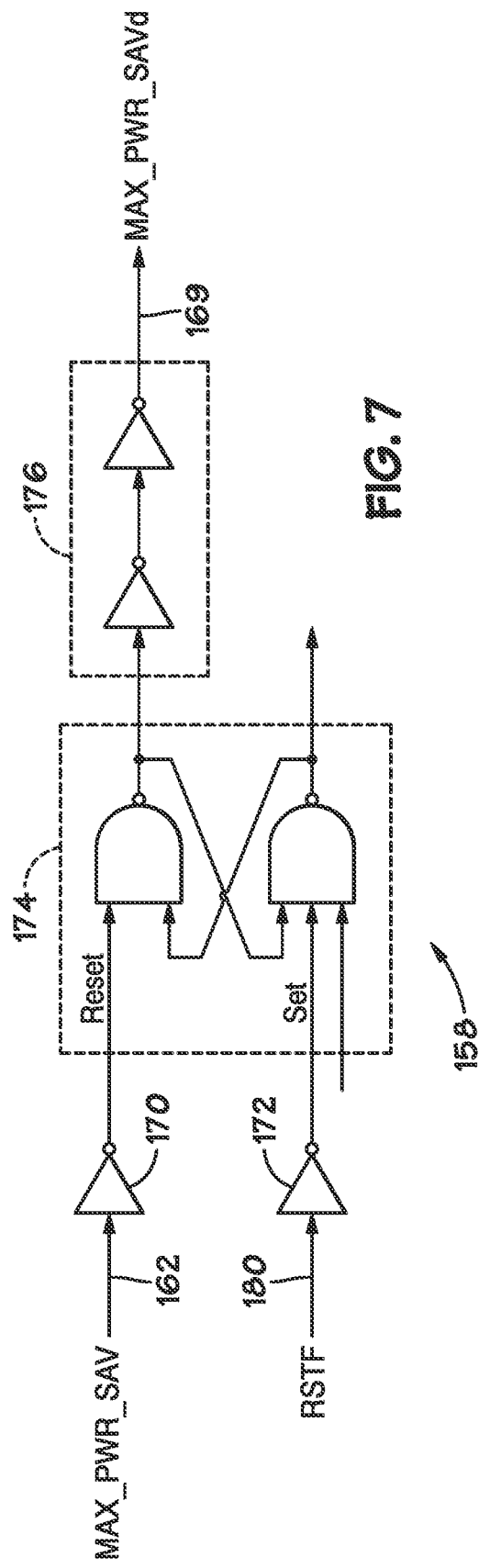
FIG. 7 is a schematic diagram of a latch that may be used in the logic circuitry of FIG. 6, according to an embodiment of the disclosure.

With the foregoing in mind, FIG. 7 is a diagram of an embodiment of the latch 158 that may be used to latch the MAX_PWR_SAV signal until the BTI toggling has cleared out of the delay lines of the DLL circuit 30. As illustrated, the latch 158 may include an inverter 170, an inverter 172, an SR latch 174, and an inverter pair 176.

The MAX_PWR_SAV signal may be supplied along the line 162 into the inverter 170. A signal RSTF (or RST with different number of inverters) may be supplied along line 180 into the inverter 172. The RSTF signal may represent the output of the NOR gate 160 or other combinational circuitry based on the MAX_PWR_SAV, WrDynRtt, WrNomRtt, and RdNomRtt signals. The inverter 170 may invert the MAX_PWR_SAV signal and output the inverted signal into a reset input of the SR latch 174 and the inverter 172 may invert the RSTF signal and output the inverted signal into a set input of the SR latch 174. When the MAX_PWR_SAV signal transitions low, the SR latch 174 output may not transition low until the reset signal indicating a clear pipeline 50 is also high. Once the reset signal is high, the output of the SR latch 174 may transition. When the output from the SR latch 174 transitions, the MAX_PWR_SAVd signal transitions low, and the memory device also transitions. Otherwise, the MAX_PWR_SAVd signal does not transition because the memory device 10 is still in power saving mode and/or the that the pipeline 50 is not clear of the injected forced toggle. The output of the SR latch 174 may supply its input to the inverter pair 176, where the inverter pair 176 may be used to match the timings of the signals with the current clock and/or to amplify the MAX_PWR_SAVd signal.

By employing the techniques described in the present disclosure, the systems and the methods described herein may allow for the mitigation of BTI degradation while the memory device 10 is in power saving mode by forcing the delay lines of the DLL circuit 30 to be toggled. The toggle may be stopped whenever a RTT command is detected in the pipeline 50 and resumed after the RTT command timing has expired. Furthermore, contention at the DQs may be avoided when a force toggle is injected through all the delay lines of the DLL circuit 30 or when a premature power saving mode idle mode exit command is sent. Additionally, the forced toggle state and RTT command state of the delay lines of the DLL circuit 30 may be switched between to avoid any false RTT state change and DQ contention. The injection of the forced toggle may occur anywhere within the pipeline 50.

While only certain features of the present disclosure have been illustrated and described herein, many modifications and changes will occur to those skilled in the art. For example, signal polarity for assertions may be inverted for at least some signals where a logic low is an assertion while a logic high is a deassertion. It is, therefore, to be understood that the appended claims are intended to cover all such modifications and changes as fall within the true spirit of the embodiments described herein.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device, comprising:
a command pipeline configured to receive a plurality command types for the memory device, wherein the command pipeline comprises delay locked loop (DLL) circuitry; and
toggling circuitry configured to inject a toggling signal into at least a portion of the command pipeline when the memory device is in a power saving mode and the command pipeline is clear of valid commands, wherein the injected toggling signal is configured to toggle gate voltages of components of the DLL circuitry.

2. The memory device of claim 1, wherein the components of the DLL circuitry comprise transistors on delay lines used by the DLL circuitry.

3. A memory device, comprising:
a command pipeline configured to receive a plurality command types for the memory device; and
toggling circuitry configured to inject a toggling signal into at least a portion of the command pipeline when the memory device is in a power saving mode and the command pipeline is clear of valid commands, wherein the toggling circuitry is configured to inject the toggling signal when no valid commands for the power saving mode are in the command pipeline.

4. The memory device of claim 3, wherein the valid commands consist of a non-target write command and a non-target read command.

5. The memory device of claim 3, wherein, when injecting the toggling signal, the toggling circuitry is configured to toggle paths for the valid commands.

6. The memory device of claim 5, wherein, when injecting the toggling signal, a path for at least one invalid command is also toggled, wherein the at least one invalid command comprises a command that is specified as not being permitted from a host device in the power saving mode.

7. The memory device of claim 6, wherein the at least one invalid command comprises a write command.

8. The memory device of claim 6, wherein the toggling circuitry comprises resolution circuitry that is configured to utilize toggling of the path for the at least one invalid command to resolve contentions at data (DQ) lines of the memory device.

9. The memory device of claim 8, wherein resolving contentions at the DQ lines comprises preventing activation of a data strobe (DQS) used to capture DQ pulses when the power saving mode is active and the path for the at least one invalid command pulses high.

10. The memory device of claim 8, wherein the toggling circuitry comprises delay circuitry configured to delay the DQ lines to compensate for delays in the resolution circuitry.

11. A method, comprising:
receiving, at toggling circuitry of a memory device, an assertion of a power saving mode signal as an indication of activation of a power saving mode; and
during the power saving mode, injecting a toggling signal into a command pipeline from the toggling circuitry, wherein injecting the toggling signal comprises toggling a first path associated with a first command and a second path associated with a second command, wherein the first command comprises a valid command receivable from a host device to the memory device in the power saving mode, and the second command comprises an invalid command that is not receivable from the host device to the memory device in the power saving mode.

12. The method of claim 11, comprising, via resolution circuitry, disabling a data strobe used to capture data signals when the indication of activation of the power saving mode coincides with assertions of a toggling via the second path.

13. The method of claim 12, comprising delaying on-die termination signals associated with the data signals to compensate for delays in the resolution circuitry.

14. The method of claim 11, comprising:
receiving, at delay circuitry, a deassertion of the power saving signal; and
delaying propagation of the deassertion of the power saving signal.

15. The method of claim 14, wherein delaying the propagation of the deassertion of the power saving signal comprises delaying the propagation of the deassertion of the power saving signal until receiving a clear signal indicating that the command pipeline is clear of the toggling signal.

16. The method of claim 15, wherein delaying the propagation comprises delaying propagation of the deassertion of the power saving signal using a latch that receives the clear signal at a reset pin of the latch.

17. The method of claim 15, wherein the clear signal is based on a plurality of logic gates receiving the power saving signal and on-die termination signals for the first and second commands.

18. The method of claim 15, comprising:
counting a first number of pulses of the toggling signal injected into the command pipeline;
counting a second number of pulses of the toggling signal leaving the command pipeline; and
asserting the clear signal when the first number is equal to the second number.

19. A system comprising:
a command pipeline;
toggling circuitry configured to inject a toggling signal into a plurality of command paths for at least a portion of the command pipeline when the system is in a power saving mode and a first command type and a second command type are not in the command pipeline, wherein a command path of the plurality of command paths corresponds to a command that is not valid during the power saving mode; and resolution circuitry configured to disable a data strobe used to capture data on data signal lines when the power saving mode is active and a signal corresponding to the command path is asserted.

20. The system of claim 19, wherein the toggling circuitry is configured to suppress injection of the toggling signal when a test mode is active for the system.

21. The system of claim 19, wherein the first command comprises a non-targeted read command, and the second command comprises a non-targeted write command.

22. The system of claim 19, wherein the command comprises a write command.

23. The memory device of claim 3, wherein the command pipeline comprises delay locked loop (DLL) circuitry, and the injected toggling signal is configured to toggle gate voltages of components of the DLL circuitry.

* * * * *